Figure 3:
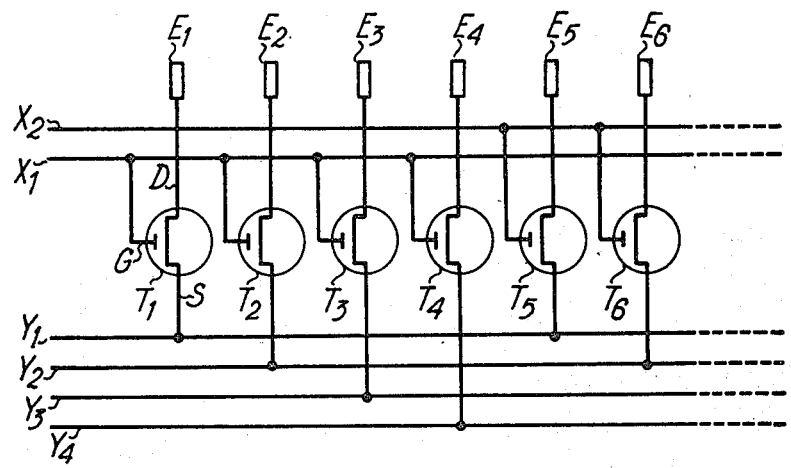

United States Patent [19]

Morin et al.

[11] 4,343,081
[45] Aug. 10, 1982

[54] PROCESS FOR MAKING SEMI-CONDUCTOR DEVICES

[75] Inventors: Francois Morin, Lanmerin; Madeleine Bonnel, Lannion, both of France

[73] Assignee: L'Etat Francais represente par le Secretaire d'Etat aux Postes et Telecommunications et a la Telediffusion (Centre National d'Etudes des Telecommunications), Issy les Moulineaux, France

[21] Appl. No.: 160,213

[22] Filed: Jun. 17, 1980

[30] Foreign Application Priority Data

Jun. 22, 1979 [FR] France .................................. 79 16083
Dec. 18, 1979 [FR] France .................................. 79 30954

[51] Int. Cl.³ .................................................. H01L 21/225
[52] U.S. Cl. ...................................... 29/571; 148/187; 148/188
[58] Field of Search ........................... 29/571; 357/23; 148/174, 188, 187

[56] References Cited

U.S. PATENT DOCUMENTS 3,258,663  6/1966  Weimer ............................ 29/571 X
3,298,863  1/1967  McCusker ........................ 29/571 X
3,423,821  1/1969  Nishimura ........................... 29/571
3,436,620  4/1969  Diemer et al. ..................... 29/571 X
3,470,610 10/1969  Breitweiser .......................... 29/571
3,520,051  7/1970  Topfer et al. ......................... 29/571
3,616,527 11/1971  Janning ................................ 29/571

Primary Examiner—G. Ozaki
Attorney, Agent, or Firm—Pearne, Gordon, Sessions, McCoy & Granger

[57] ABSTRACT

The present invention relates to a process for making semi-conductor components on an amorphous substrate, comprising two phases, wherein, in a first phase, the substrate is introduced into a deposition chamber and a uniform deposit is made of four successive primary layers on all this substrate, without contact with the outside atmosphere: a first layer of protective insulating material, a second layer of semiconductor material, a third layer of insulating material, of smaller thickness than the first layer, and finally a fourth layer of a metal; and, in a second phase, the substrate coated with these four layers is withdrawn from the deposition chamber and the last three layers are subjected to photoetching and ancillary deposition operations, which are appropriate for the structure of the component to be obtained.

5 Claims, 11 Drawing Figures

FIG.1
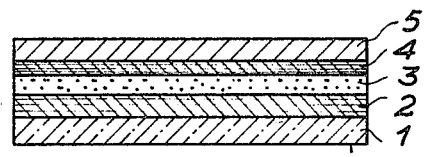
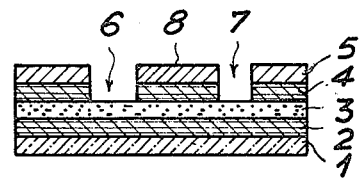
FIG.2a
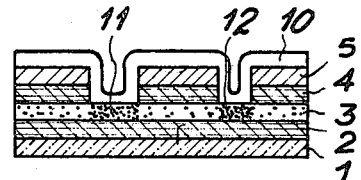
FIG.2b
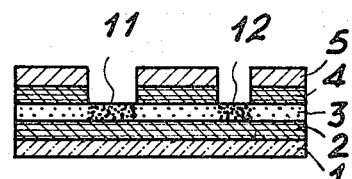
FIG.2c
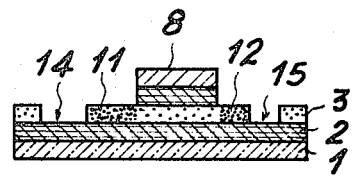
FIG.2d
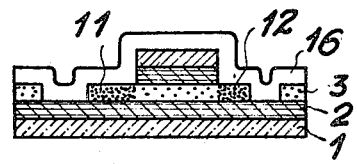
FIG.2e
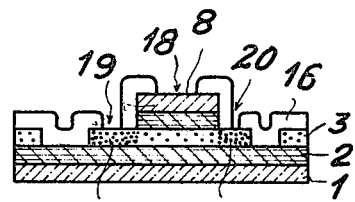
FIG.2f
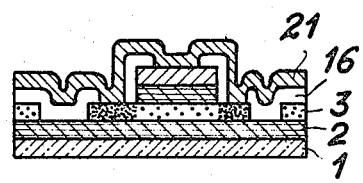
FIG.2g
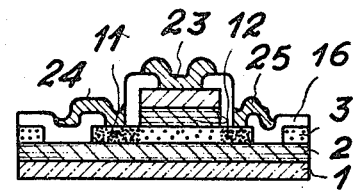
FIG.2h

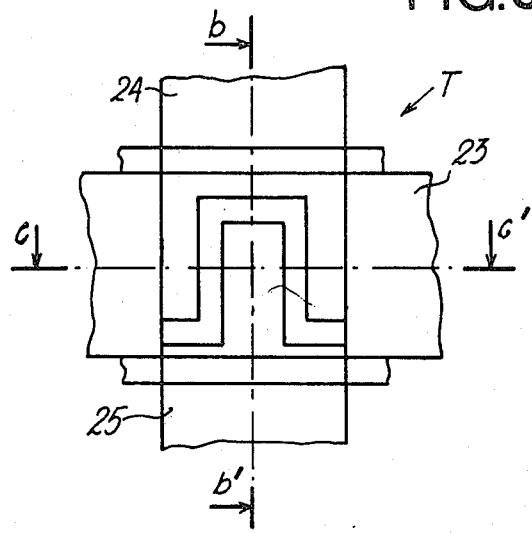
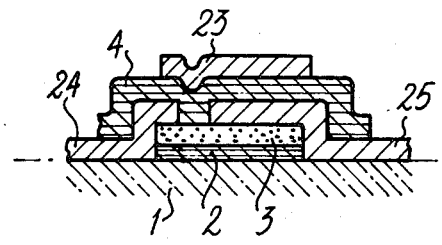
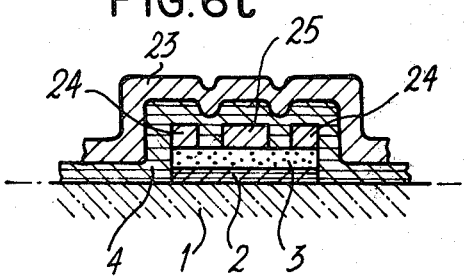
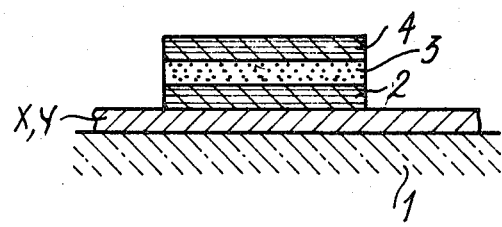

PROCESS FOR MAKING SEMI-CONDUCTOR DEVICES

The present invention relates to a process for making semi-conductor components and to a component obtained by this process. It finds particular application in the production of thin-film transistors (hereinafter abbreviated to T.F.T.s) and of circuits using T.F.T.s.

A T.F.T. is a field effect transistor with insulated grid. It is similar to an MOS (metal-oxide semiconductor) transistor, with the difference that it is made on an amorphous substrate and not on a monocrystalline silicon wafer. Consequently, T.F.T. circuits may be of very large dimensions and are no longer limited by the size of the crystalline substrate.

In practice, a T.F.T. is obtained by deposit in vacuo of its different constituents on a glass substrate. Each layer (semiconductor, insulator, metal) is deposited through a metal mask (of the Stencil-mask type) in intimate contact with the substrate. To have a good definition of the patterns, the deposits are made by evaporation in vacuo. The materials to be evaporated are disposed in crucibles heated by the Joule effect or by electron bombardment. The in-situ masking excludes deposits in a gaseous atmosphere (cathode sputtering, chemical deposit by gaseous process, etc.) because of the sheath phenomena which render the edges of the patterns blurred. In the best of cases, an in vacuo mask exchanger enables all the T.F.T. (or T.F.T. circuit) to be made in one pumping cycle, this avoiding pollution of the semiconducting layer and of the insulator-semiconductor interface.

Concerning this technique and applications thereof, the article by A. G. Fischer entitled 'Flat TV panels with polycrystaline layers' published in the journal 'Microelectronics', Vol. 7, No. 4, 1976, pages 5 to 15, may be consulted.

Although the main advantage of this technique of making T.F.T.s is a rapid execution of the circuits, it has the drawback of being suitable only for circuits of modest dimensions and definition. In fact, a metal mask of high definition and large outer dimensions comprises a large number of very small openings, has mediocre mechanical properties, expands, and deforms. As a plurality of masks are necessary and as the patterns must be superimposed with high precision, a limitation is rapidly apparent. It is estimated that this method enables circuits of overall dimensions of the order of about ten centimeters to be produced, not having more than four transistors per square millimeter. These modest performances limit the applications of the T.F.T.

Furthermore, this technique imposes that the layers constituting the transistor be disposed on a substrate at ambient temperature, in order to avoid the expansion of the masks. Now, the semiconductor deposit which is generally polycrystalline, would necessitate the use of a much higher substrate temperature (a few hundred degrees) in order to improve crystallization.

Other processes of manufacture have been developed, employing partial photoetching of the layers. They have the drawback of polluting the semiconductor layer in its active part. A description of these processes will be found in the article by J. C. Erskine and A. Cserhati entitled 'Cadmium selenide thin-film transistors' published in the journal 'Journal of Vaccum Science Technology', Vol. 15(6), Nov./Dec. 1978, pages 1823 to 1835.

It is an object of the present invention to provide a process for manufacturing semiconductor components and particularly T.F.T.s, which avoids all these drawbacks. The process of the invention employs the principle of photoetching whilst conserving one of the advantages of the process described hereinabove, namely the production of all the layers constituting the T.F.T. in one manufacturing cycle, thus avoiding the pollution of the layers and interfaces by outside agents. However, the invention has the following advantages over the known process:

1. The substrate may be heated during the deposit of the semiconductor, this leading to an improvement in the crystallization.
2. The dimensions of the substrate may be as large as is desired, within the limit of the homogeneity of the deposits.
3. The deposition techniques are no longer limited to evaporation is vacuo and cathode sputtering, chemical deposit by gas process, etc. may be used.
4. The definition of the patterns is increased by the use of photographic masks of high precision, already used for making integrated circuits.
5. The complexity of the circuits made is greater and attains that of integrated circuits.
6. The process of photoetching described hereinbelow effects the self-alignment of the grid on the channel of the T.F.T., this eliminating the parasitic grid-source and grid-drain capacitances.

To this end, the process according to the invention comprises two phases:

(A) in a first phase,
   the substrate is introduced into a deposition chamber,
   a uniform deposit of four successive primary layers is made on all this substrate, without contact with the outside atmosphere: a first layer of protective insulating material, a second layer of semiconductor material, a third layer of insulating material, of smaller thickness than the first layer, and finally a fourth layer of a metal, (B) and, in a second phase:
   the substrate coated with these four layers is withdrawn from the deposition chamber,
   the last three layers are subjected to photoetching and ancillary deposition operations, which are appropriate for the structure of the component to be obtained.

Figure 4:
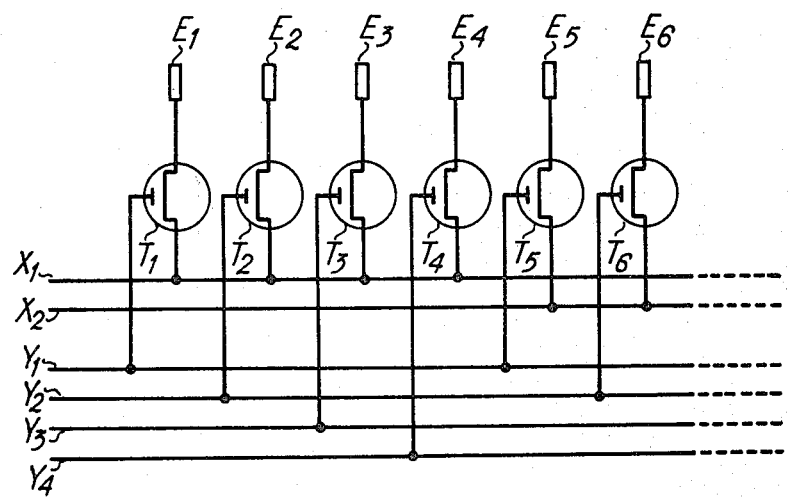
Figure 5A:
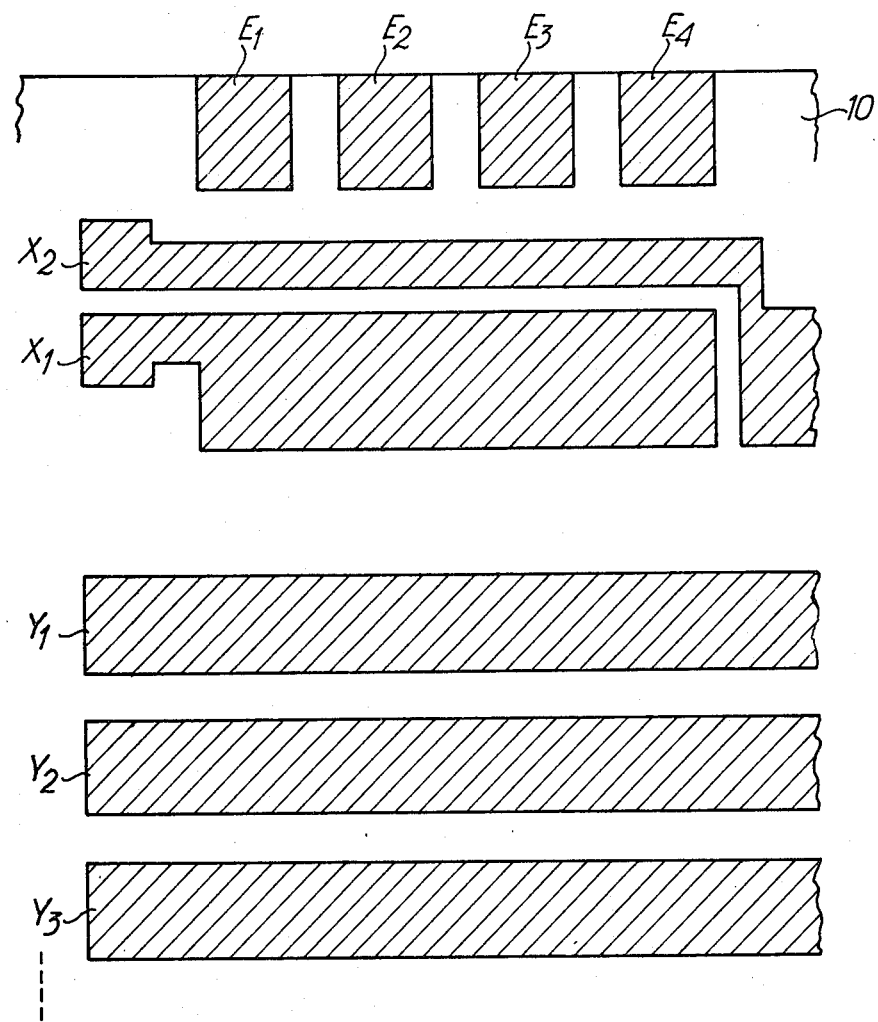
Figure 5B:
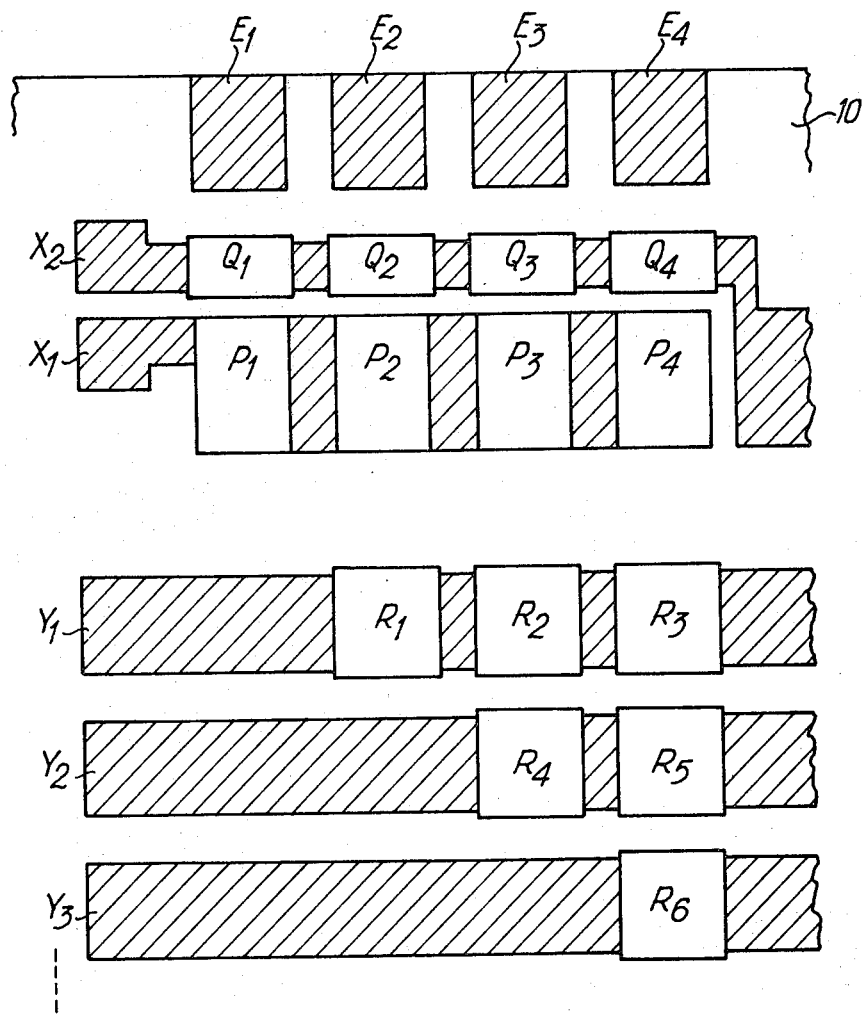
Figure 5C:
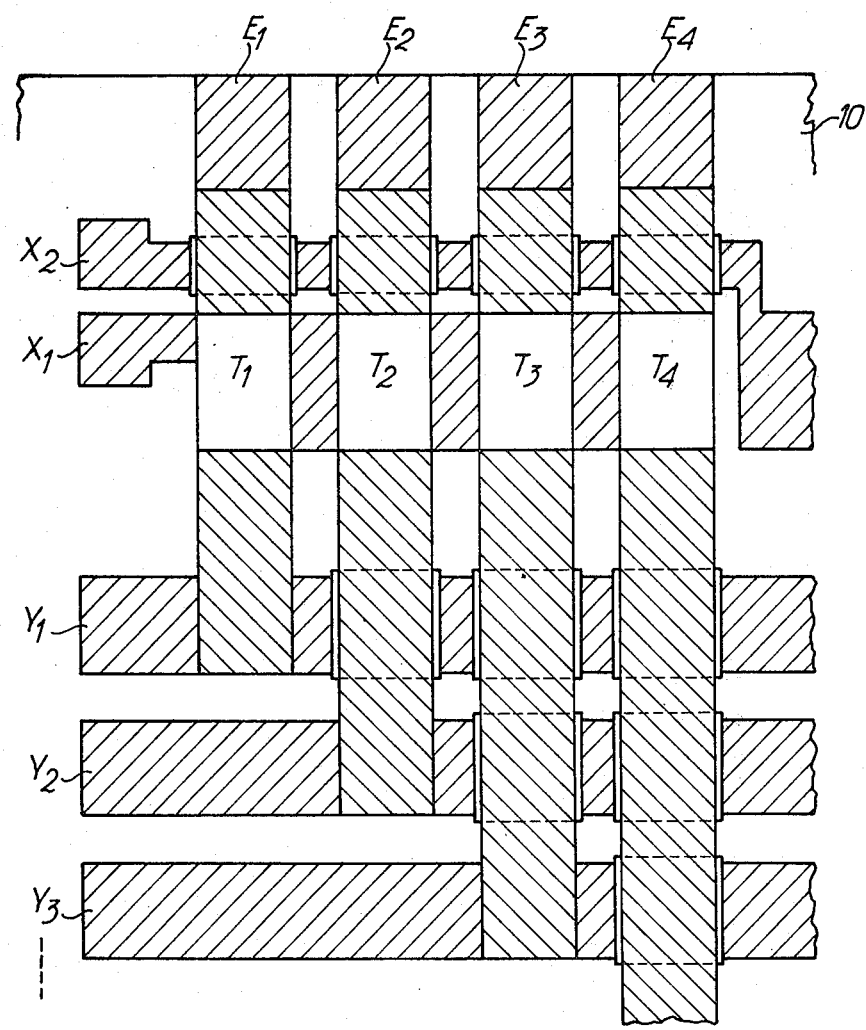

The invention will be more readily understood on reading the following description with reference to the accompanying drawings, in which:

FIG. 1 shows a schematic section of the substrate obtained after the first phase, FIG. 2 shows a schematic section of the structure obtained at various stages of the second phase, FIG. 3 schematically shows a multiplexed T.F.T. control circuit for a teleprinter restitution head, according to a first embodiment, FIG. 4 schematically shows a multiplexed T.F.T. control circuit for a teleprinter restitution head, according to a second embodiment, FIGS. 5a, 5b and 5c schematically show, in plan view, three stages of manufacture of the control circuit, FIG. 6 shows a T.F.T. in plan view (a) and in transverse sections (b) and (c).

FIG. 7 shows a crossing zone in section.

Referring now to the drawings, FIG. 1 shows in schematic section (neither the proportion nor the dimensions are respected) a substrate 1 on which are deposited; a thick layer 2 of insulating material, a layer 3 of semiconductor, a thin layer 4 of insulator and finally a layer 5 of metal. The operating conditions relative to this first phase may be as follows:

The substrate 1 on which it is desired to make the T.F.T. circuit is firstly introduced into a deposition chamber. Four successive deposits are made, without contact with the outside atmosphere:

1. Deposit of the thick insulating layer 2

To protect the circuit from the impurities which may be contained in the substrate, a thick insulating layer 2 is firstly deposited, after degassing. This layer will serve as barrier for the alkaline ions which might diffuse in the semiconductor and deteriorate it. A layer of alumina deposited by evaporation of sapphire employing an electron gun may for example be used.

2. Deposit of the semiconductor film 3

For this operation, the substrate is taken to as high a temperature as possible (generally a little below 500° C. if the substrate is made of glass). In the example described here, the semiconductor is cadmium selenide—CdSe—deposited by evaporation in vacuo. The temperature of the substrate is maintained at 400° C. during the deposition.

3. Deposit of the thin insulating layer 4

The grid insulator is then deposited. The power of modulation of the grid depends on its dielectric qualities. Its thickness will determine the breakdown voltage of the transistor. In the example described here, a thin layer of alumina, prepared as in 1, is used.

4. Deposit of the grid metal 5

Molybdenum evaporated with an electron gun may be used.

At this stage, the deposits may undergo an appropriate thermal treatment: annealing in vacuo or in a special atmosphere.

After it has been removed from the deposition chamber, the substrate, on which the four primary layers have just been deposited, is then subjected to the operations of photoetching and ancillary deposits appropriate for the second phase.

Photoetching consists in using a photosensitive resin, sensitized to ultra-violet light, through a photographic mask reproducing the desired pattern. After development and hardening of the resin, the exposed parts are eliminated by chemical etching. After etching, the protective layer of resin may easily be removed by dissolution in a suitable solvent.

This technique is currently used in the manufacture of integrated circuits and transistors, but, in the present case, the steps of the process of manufacture are different and original. They are illustrated in FIG. 2, which shows eight sections a, b, c, d, e, f, g, and h, corresponding to the following eight phases:

(a) Photoetching of the metal layer 5 and the insulating layer 4 with the aid of a first mask. This first photoetching makes windows 6 and 7 on the semiconductor and defines the grids 8 of the T.F.T.s. In the example described here, the molybdenum and alumina not protected by the resin are selectively attacked by immersion in acid solutions.

(b) Deposit of a diffusing metal 10 and diffusion thereof by annealing. This diffusion renders the parts 11 and 12 of the semiconductor 3 defined in (a) conducting; the diffusing metal may be aluminum or chromium, and may diffuse towards 400° C.

(c) Elimination of the excess metal by chemical attack, which must be selective, since it must leave the grid metal 5 intact.

(d) With the aid of a second mask, photoetching of the semiconductor layer in order to create windows 14 and 15 which insulate the components on the substrate. In the example taken, the cadmium selenide may be eliminated by a solution of bromine-ethanol.

(e) Deposit of a thick insulator 16, different from insulators 1 and 4. This may, for example, be $SiO_2$.

(f) With the aid of a third mask and a selective chemical attack, opening of windows 18, 19 and 20 in the thick insulator, in order to be able to make contacts on the grid 8, source 11 and drain 12 of each transistor.

(g) Deposit of a layer 21 of contact metal. This metal may, for example, be aluminum.

(h) With the aid of a fourth mask, photoetching of the contacts. Contact 23 of the grid, 24 of the source and 25 of the drain are then obtained.

The process of manufacture which has just been described, by the advantages that it procures, extends the field of application of the T.F.T. The possibility of making circuits of large dimensions (the limit is imposed by the homogeneity of the deposits and the capacity of the mask aligner, but the production of circuits of several square decimeters may be envisaged) enables circuits to be designed for controlling flat screens, directly on the support of the screen, this solving the problems of connection. The high resolution of the photoetching allows the production of complex circuits (shift register, memories, multiplexing circuits, etc.) and makes it possible to make circuits associated with display matrices or teleprinter heads (read-out/restitution).

A process for making a restitution head for a teleprinter will be described by way of example.

It will be recalled that the electrosensitive paper which may be used in teleprinting may be classified in two families, the first grouping electrothermosensitive and metallized papers, and second grouping the electrolytic and electrocatalytic ones.

At the present time, only slow teleprinters (employing stylet) or alphanumerical printers are known for the first family; for the second family, no marketed apparatus exists.

To obtain a rapid teleprinter, of the same type as those which use (or which will use) heat-sensitive paper, a restitution head with multiple electrodes disposed in the form of a comb must be produced so that the mechanical displacements of the head are eliminated. There is then a problem of connection due to the very large number of connecting wires emerging from the head and the high definition of the electrodes, hence the necessity of multiplexing the latter. According to a known art, this multiplexing is obtained by associating a diode with each electrode.

Now, if, instead of heat-sensitive paper, an electrosensitive paper is used having a conducting base, the multiplexing circuits with diodes become unsuitable. It is no longer a diode which must be associated with each electrode, but a transistor, this considerably increasing the problems of connection.

It is an object of the present invention to solve this problem. To this end, the process used is characterized in that:

a row of electrodes ($E_1$, $E_2$ ... ) and two families of metal multiplexing channels ($X_1$, $X_2$ ... and $Y_1$, $Y_2$ ...

) parallel to one another and to said row, are deposited on an insulating substrate;

four primary layers, insulating, semiconducting, insulating and metallic, respectively, are deposited on this substrate by the operations of the first phase mentioned hereinbefore;

the operations of the second phase, are then effected, the photoetching operations being carried out so as to leave zones constituted by said four layers, these zones being disposed on the one hand opposite each electrode at the desired site for control transistors (zones $P_1$, $P_2$...) and on the other hand at crossing sites located on the two families of metal channels on a level with the electrodes (zones $Q_1$, $Q_2$... on the first family and $R_1$, $R_2$... on the second);

the operations in accordance with those described hereinabove are carried out on zones $P_1$, $P_2$... to obtain at each site a T.F.T., or $T_1$, $T_2$...

during the operations of depositing the layer of contact metal of the T.F.T.s and of photoetching this layer, metal connecting channels are produced, connecting, for each T.F.T., the grid to one of the multiplexing channels of one of the families, the source to one of the channels of the other family and the drain to the electrode disposed opposite this T.F.T.

The restitution head shown in FIGS. 3 and 4, in two slightly different embodiments, comprises read-in electrodes $E_1$, $E_2$... connected to transistors $T_1$, $T_2$... of T.F.T. type. Each of these transistors comprises a grid G, a source S and a drain D. The control circuit of these transistors comprises two families of metal channels the first formed by channels $X_1$, $X_2$... and the second of channels $Y_1$, $Y_2$... In the variant of FIG. 3, the channels $X_1$, $X_2$... are connected to the grids of the T.F.T.s and the channels $Y_1$, $Y_2$... to the sources of said T.F.T.s. In the variant of FIG. 4, the channels $X_1$, $X_2$... are connected to the sources of the T.F.T.s and the channels $Y_1$, $Y_2$... to the grids of said T.F.T.s.

The principle of functioning of these two variants of a restitution head is summarized in the two Tables I and II hereinafter, in which a "1" indicates the application of a control voltage to a channel and a "0" the absence of such a voltage. In these Tables, only a few electrodes are shown in the first column, the others being controlled in accordance with the same principle.

FIGS. 5a to 5c illustrate different steps of the process for manufacturing a restitution head according to the variant of FIG. 3.

Electrodes $E_1$, $E_2$... and metal multiplexing channels $X_1$, $X_2$... and $Y_1$, $Y_2$, $Y_3$... are deposited on an insulating substrate 10 (for example made of glass). This deposit may be effected by evaporation in vacuo using an electron gun. The material to be evaporated is, for example, gold deposited on a chromium adhering layer. The shape of the electrodes and channels is obtained by photoetching. The substrate then has the appearance of FIG. 5a where the dimensions and proportions have not been respected in order to render the drawing clearer. The contact studs and supply circuits have not been shown.

Four consecutive deposits (insulator/semiconductor/insulator/metal) are then made on the whole substrate of FIG. 5a, in accordance with the technique described hereinbove.

A first photoetching of these layers is carried out so as to leave zones $P_1$, $P_2$, $P_3$... at the site of the future T.F.T.s and zones $Q_1$, $Q_2$, $Q_3$... on channels $X_1$, $X_2$... level with the electrodes, and finally, zones $R_1$, $R_2$, $R_3$... on channels $Y_1$, $Y_2$... at the site of the future crossings on the multiplexing channels (FIG. 5b).

Transistors $T_1$, $T_2$, $T_3$... are then made at the site of zones $P_1$, $P_2$, $P_3$..., in accordance with the operations described hereinbefore (FIG. 5c).

In FIG. 6, a transistor T is shown in plan view (a) and in section along bb' and along cc' (b and c respectively). The references used in this Figure are those of FIG. 1: substrate 1, first insulating layer 2, semiconductor layer 3, second insulating layer 4, grid contact 23, source contact 24, and drain contact 25.

The crossing zones $Q_1$, $Q_2$... and $R_1$, $R_2$... are intended to avoid the electrical contacts between the vertical connections and the horizontal multiplexing channels. Of course, these channels do not exist at the site where a multiplexing channel must be connected to a vertical connection. A crossing zone comprises, in accordance with FIG. 7, on one of the conducting channels X or Y deposited on the substrate, three of the four layers deposited during the first phase, namely an insulating layer 2, a semiconductor layer 3 and an insulating layer 4. The upper metal layer 5 of the zones is eliminated at the moment of photoetching of the grid of the T.F.T.s. This therefore does not involve any additional operation. Of course, the semiconducting properties of the layer 3 play no role in this insulation structure.

The crossing zones advantageously have dimensions which slightly exceed the dimensions of the conducting channels which they are to insulate.

The connections between the transistors, the restitution electrodes and the appropriate control channels are obtained by deposits of metal layers made during the deposit of the metal layer intended for producing the contacts of the T.F.T.s (reference 21 in FIG. 2g) The final result is illustrated in FIG. 5c.

Thus, apart from the prior deposit of the multiplexing channels, the process for manufacturing the control circuit according to the ivention merely uses operations necessary for obtaining T.F.T.s and therefore does not involve any additional operation.

TABLE I

| Electrodes | Control | | | | | |
|---|---|---|---|---|---|---|
| | $X_1$ | $X_2$ | $Y_1$ | $Y_2$ | $Y_3$ | $Y_4$ |
| $E_1$ | 1 | 0 | 0 | 1 | 1 | 1 |
| $E_2$ | 1 | 0 | 1 | 0 | 1 | 1 |
| $E_5$ | 0 | 1 | 0 | 1 | 1 | 1 |
| $E_6$ | 0 | 1 | 1 | 0 | 1 | 1 |

TABLE II

| Electrodes | Control | | | | | |
|---|---|---|---|---|---|---|
| | $X_1$ | $X_2$ | $Y_1$ | $Y_2$ | $Y_3$ | $Y_4$ |
| $E_1$ | 0 | 1 | 1 | 0 | 0 | 0 |
| $E_2$ | 0 | 1 | 0 | 1 | 0 | 0 |
| $E_5$ | 1 | 0 | 1 | 0 | 0 | 0 |
| $E_6$ | 1 | 0 | 0 | 1 | 0 | 0 |

What is claimed is:

1. In a process for making thin film transistors on an amorphous substrate, the steps;
(A) in a first phase: of introducing the substrate in a deposition chamber, making on all this substrate, without contact with the outside atmosphere, a uniform deposit of four successive primary layers; a first layer of protective insulating material, a second layer of semiconductor material, a third layer of insulating material, of smaller thickness than the first layer, and finally a fourth layer of a metal, (B) and, in a second phase, of withdrawing the substrate coated with these four layers from the deposition chamber, by a first photoetching operation through a first mask, two openings for each transistor are opened through the fourth layer of metal and the third layer of insulator, the metal part remaining between these two openings constituting the grid of the transistor, and a layer of diffusing metal is deposited on the whole of the substrate, then, by selective chemical attack, this second metal is eliminated, this leaving, in the semiconductor, two conducting zones, one constituting the drain and the other the source of the transistor.

2. The process of claim 1, wherein, with the aid of a second mask, a photoetching is then effected of the semiconductor in order to separate the transistors from one another.

3. The process of claim 2, wherein a deposit of a thick insulator different from the insulator used for the first and the third layer is then made on the whole substrate, after which, with the aid of a third mask, a window is opened in this thick insulator opposite the grid, the drain and the source.

4. The process of claim 3, wherein a deposit is then made of a layer of contact metal on the whole substrate after which, with the aid of a fourth mask, this layer is photoetched in order to obtain a grid contact, a drain contact and a source contact.

5. A process for making a restitution head of a teleprinter comprising a row of electrodes connected to a multiplexed control circuit, comprising the steps of:

depositing on an insulating substrate a row of electrodes and two families of metal multiplexing channels parallel to one another and to said row, making on all this substrate, without contact with the outside atmosphere, a uniform deposit of four successive primary layers; a first layer of protective insulating material, a second layer of semiconductor material, a third layer of insulating material, of smaller thickness than the first layer, and finally a fourth layer of a metal, carrying out a photoetching operation being so as to leave zones constituted by said four layers, these zones being disposed on the one hand opposite each electrode at the desired site for control resistors and on the other hand at crossing sites located on the two families of metal channels on a level with the electrodes, carrying out on said zones operations to obtain at each site a thin film transistor, these operations consisting in a first photoetching operation through a first mask, two openings for each transistor being opened through the fourth layer of metal and the third layer of insulator, the metal part remaining between these two openings constituting the grid of the transistor and in depositing a layer of diffusing metal on the whole of the substrate, then in selective chemical attacking of this metal for eliminating it, this leaving, in the semiconductor, two conducting zones, one constituting the drain and the other the source of the transistor, and during the operations of depositing the layer diffusing metal layer of the thin film transistors, and of photoetching this layer, producing metal connecting channels connecting, for each transistor, the gate to one of the multiplexing channels of one of the families, the source to one of the channels of the other family and the drain to the electrode disposed opposite this transistor.

* * * * *